United States Patent
Xu et al.

(10) Patent No.: US 6,514,805 B2
(45) Date of Patent: Feb. 4, 2003

(54) TRENCH SIDEWALL PROFILE FOR DEVICE ISOLATION

(75) Inventors: Daniel Xu, Mountain View, CA (US); Erman Bengu, San Jose, CA (US); Ming Jin, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/896,532

(22) Filed: Jun. 30, 2001

(65) Prior Publication Data

US 2003/0003681 A1 Jan. 2, 2003

(51) Int. Cl.[7] .......................... H01L 21/00; H01L 21/76
(52) U.S. Cl. ...................... 438/164; 438/405; 438/427; 438/703
(58) Field of Search ................. 438/164, 405, 438/412, 424, 427, 713, 978, 700, 701, 296

(56) References Cited

U.S. PATENT DOCUMENTS

| | | | | |
|---|---|---|---|---|
| 3,887,404 A | * | 6/1975 | Chane | 156/8 |
| 4,007,104 A | * | 2/1977 | Summers et al. | 438/701 |
| 4,517,730 A | * | 5/1985 | Meignant | 438/701 |
| 5,079,616 A | * | 1/1992 | Yacobi et al. | 357/60 |
| 5,094,973 A | * | 3/1992 | Pang | 438/424 |
| 5,272,105 A | * | 12/1993 | Yacobi et al. | 438/412 |
| 5,279,687 A | * | 1/1994 | Tuppen et al. | 148/33.2 |
| 5,279,982 A | * | 1/1994 | Crotti | 438/412 |
| 5,296,716 A | | 3/1994 | Ovshinsky et al. | |
| 5,470,781 A | * | 11/1995 | Chidambarrao et al. | 438/701 |
| 5,484,507 A | * | 1/1996 | Ames | 156/644.1 |
| 5,665,633 A | * | 9/1997 | Meyer | 438/427 |
| 5,789,758 A | | 8/1998 | Reinberg | |
| 5,879,955 A | | 3/1999 | Gonzalez et al. | |
| 5,910,339 A | * | 6/1999 | Blakely et al. | 427/376.2 |
| 5,920,788 A | | 7/1999 | Reinberg | |
| 5,933,365 A | | 8/1999 | Klersy et al. | |
| 5,970,336 A | | 10/1999 | Wolstenhome et al. | |
| 5,998,244 A | | 12/1999 | Wolstenholme et al. | |
| 6,002,140 A | | 12/1999 | Gonzalez et al. | |
| 6,031,287 A | | 2/2000 | Harshfield | |
| 6,034,417 A | * | 3/2000 | Clampitt | 257/623 |
| 6,087,674 A | | 7/2000 | Ovshinsky et al. | |
| 6,153,890 A | | 11/2000 | Wolstenholme et al. | |
| 6,198,158 B1 | * | 3/2001 | Clampitt | 257/623 |
| 6,204,145 B1 | * | 3/2001 | Noble | 438/412 |
| 6,229,157 B1 | | 5/2001 | Sandhu | |
| 6,258,696 B1 | * | 7/2001 | Lee et al. | 438/424 |
| 6,355,567 B1 | * | 3/2002 | Halle et al. | 438/700 |
| 6,373,123 B1 | * | 4/2002 | Clampitt | 257/623 |
| 6,403,430 B1 | * | 6/2002 | Clampitt | 438/296 |
| 2002/0055231 A1 | * | 5/2002 | Clampitt | 438/259 |

* cited by examiner

Primary Examiner—Olik Chaudhuri
Assistant Examiner—David S Blum
(74) Attorney, Agent, or Firm—Blakely, Sokoloff, Taylor & Zafman LLP

(57) ABSTRACT

A method comprising forming a first trench in a substrate, and forming a second trench in the substrate, the second trench intersecting the first trench and having a retrograde sidewall profile relative to a direction from a top of the trench to a bottom of the trench. An apparatus comprising a matrix of cells in a substrate formed by a plurality of first trenches and a plurality of second trenches, the plurality of second trenches intersecting the plurality of first trenches and having a retrograde sidewall profile relative to a direction from a top to a bottom of the respective trench; and an electrically accessible storage device coupled to respective ones of the matrix of cells.

12 Claims, 5 Drawing Sheets

TRENCH SIDEWALL PROFILE FOR DEVICE ISOLATION

BACKGROUND

1. Field

Semiconductor devices and isolation techniques.

2. Background

In the fabrication/manufacture of devices on a substrate, such as circuit devices on a die or chip, it is often desirable to electrically isolate neighboring devices from one another in terms of device activity. For example, in an array of circuit devices that may form component parts of one or more integrated circuits on a chip, it is generally desirable to electrically isolate the electrical activity (e.g., current flow) within the device. In an array of memory devices, isolation of devices is desirable to maintain the integrity of the stored data (e.g., bits).

In terms of isolating devices formed in or on a semiconductor substrate, isolation is typically accomplished by forming passivation areas around active device areas by local oxidation of silicon (LOCOS) or shallow trench isolation (STI) techniques. Regarding STI techniques, a trench is formed by etching into the substrate to remove typically semiconductor material and the formed trenches are filled with a dielectric material such as silicon dioxide. In one example, to form the trench, an isotropic etch chemistry is used with the objective to form trench sidewalls generally orthogonal to the substrate surface (i.e., a straight-edged sidewall). Unfortunately, it is difficult to obtain trench sidewalls that are orthogonal to the substrate surface but instead such sidewalls are generally pro-grade (i.e., an angle between (1) an orthogonal projection at the trench edge and (2) the sidewall edge is less than 180°).

As spacing between circuit devices becomes increasingly close, the need for effective isolation from, for example, leakage currents, become important. Unfortunately, with pro-grade trench sidewalls, the possibility of stringers of conductive or partially conductive material exists between devices. Such stringers allow for current flow (e.g., leakage current) between the devices. In terms of memory devices, such stringers can cause a resistive path between neighboring bits causing isolation failure.

What is needed are improved isolation techniques and a device structure with improved device isolation.

BRIEF DESCRIPTION OF THE DRAWINGS

The features, aspects, and advantages of the invention will become more fully apparent from the following Detailed Description, appended claims, and accompanying drawings in which:

DETAILED DESCRIPTION

A method is described. In one embodiment, the method includes forming a first trench in a substrate and forming a second trench in the substrate, the second trench intersecting the first trench and having a retrograde sidewall profile relative to a direction from a top of the trench to a bottom of the trench. In another embodiment, a method includes defining a matrix of cells in the substrate by forming a plurality of first trenches and a plurality of second trenches. The plurality of second trenches intersects the plurality of first trenches and has a retrograde sidewall profile relative to a direction from a top to a bottom of the respective trench. The method also includes electrically isolating respective ones of the matrix of cells (e.g., device cells).

An apparatus is further disclosed. In one embodiment, the apparatus includes a matrix of cells in a substrate formed by a plurality of first trenches and a plurality of second trenches. The plurality of second trenches intersect the plurality of first trenches and have a retrograde sidewall profile relative to a direction from a top to a bottom of the respective trench. The apparatus also includes an electrically accessible storage device coupled to respective ones of the matrix of cells.

In the embodiments described below, a technique for isolating devices is described. The technique offers improved isolation by forming retrograde trenches in the substrate. In this sense, retrograde means that an angle between (1) an orthogonal projection at the trench edge and (2) the sidewall edge is greater than 180°.

Figure 1:
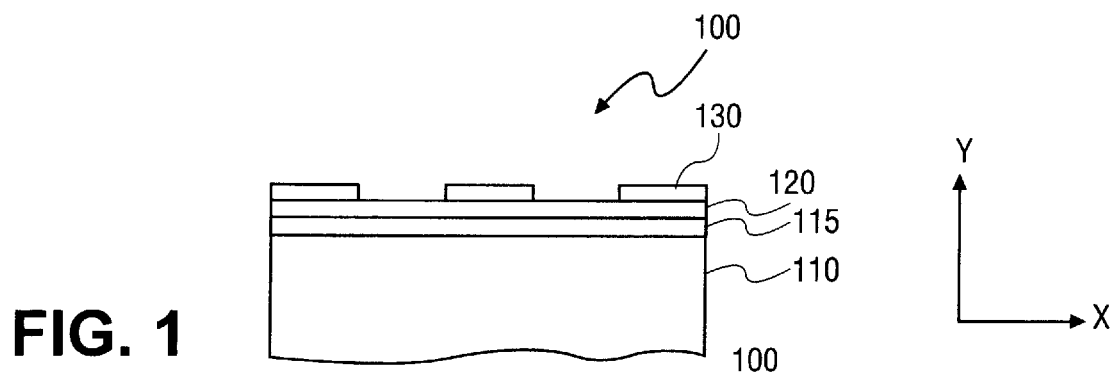
FIG. 1 shows a cross-sectional side view of a portion of a substrate having a first dielectric layer and a second dielectric layer over the surface of a substrate and a mask defining areas for trench openings into the substrate.

FIGS. 1 through 9 describe the formation of a matrix of cells formed in a substrate and isolated by trench isolation techniques. FIG. 1 shows a portion of a structure within which a matrix of cells is to be formed. Structure 100 is a portion including the entire portion of a substrate such as a semiconductor substrate (e.g., silicon substrate). It is appreciated that other substrates, such as silicon on insulator (SOI) or glass, and substrates that contain ceramic or organic material are also suitable. Further, substrate 110 may itself have active devices formed thereon with one or more levels of interconnect formed therebetween.

Overlying substrate 110 in the structure shown in FIG. 1 is first dielectric layer 115. First dielectric layer 115 is introduced as a blanket layer over the portion of the substrate shown in FIG. 1. First dielectric layer is, for example, an oxide (e.g., silicon dioxide) layer introduced by thermal growth or deposition. A representative thickness on the order of 100 angstroms (Å) is suitable.

Overlying first dielectric layer 115 in the structure shown in FIG. 1 is second dielectric layer 120. In one embodiment, second dielectric layer 120 is a material having a different etch characteristic than first dielectric layer 115. In this regard, second dielectric layer 120 is selected such that for at least certain etch chemistries, such etch chemistry will favor the removal of second dielectric layer 120 over first dielectric layer 115. In one embodiment, where first dielectric layer 115 is an oxide (e.g., silicon dioxide), second dielectric layer 120 is silicon nitride ($Si_3N_4$). A representative thickness on the order of 1000 to 2000 Å is suitable.

Overlying second dielectric layer 120 on the structure of FIG. 1 is first masking material 130. In one embodiment, first masking material is a photoimageable material such as a positive photoresist. FIG. 1 shows first masking material patterned to define xz dimensions for trench openings in the structure.

Figure 2:
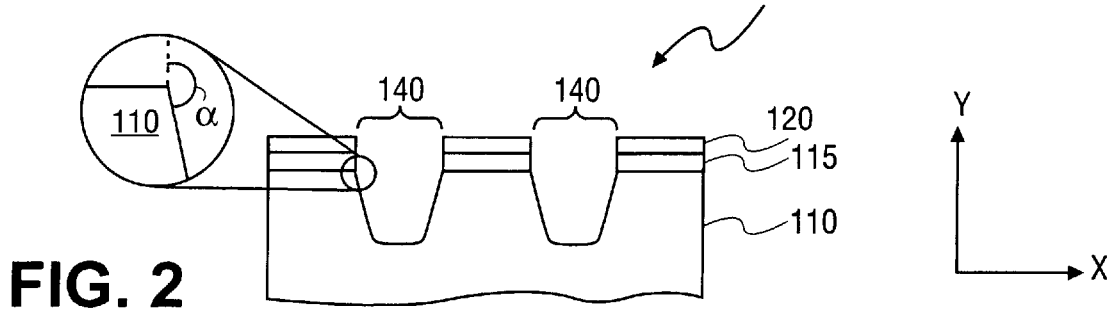
FIG. 2 shows the structure of FIG. 1 after forming trenches in the substrate and removing the masking material.

FIG. 2 shows the structure of FIG. 1 following the formation of trenches 140 in the substrate. Trenches 140 are introduced to a trench depth, in the example of substrate 110 of a silicon substrate, of more than 550 nanometers (nm) into substrate 110. Trenches 140 may be defined by etching with a generally anisotropic etch chemistry.

Referring to FIG. 2, there is shown trenches 140 formed into substrate 110 and having a pro-grade sidewall angle. In this regard, an angle, α, between a projection orthogonal to the surface of substrate 110 at the edge of trench 140 and edge of the sidewall of the trench define an angle, α, less than 180°.

Figure 3:
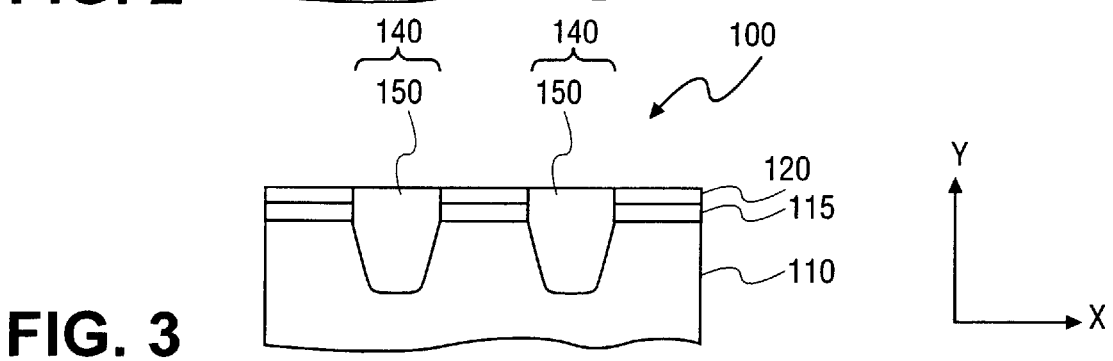
FIG. 3 shows the structure of FIG. 2 after introducing a dielectric material into the trenches and planarizing the substrate surface.

FIG. 3 shows the structure FIG. 2 following the introduction of dielectric material 150 into trenches 140. In one embodiment, the dielectric material is an oxide, such as silicon dioxide, introduced by chemical vapor deposition (CVD). Following the introduction of dielectric material 150 into trenches 140, the superior surface (as viewed) is planarized. One technique to planarize a surface of the structure is a chemical mechanical polish (CMP) with second dielectric layer 120 serving as a polish stop.

Figure 4:
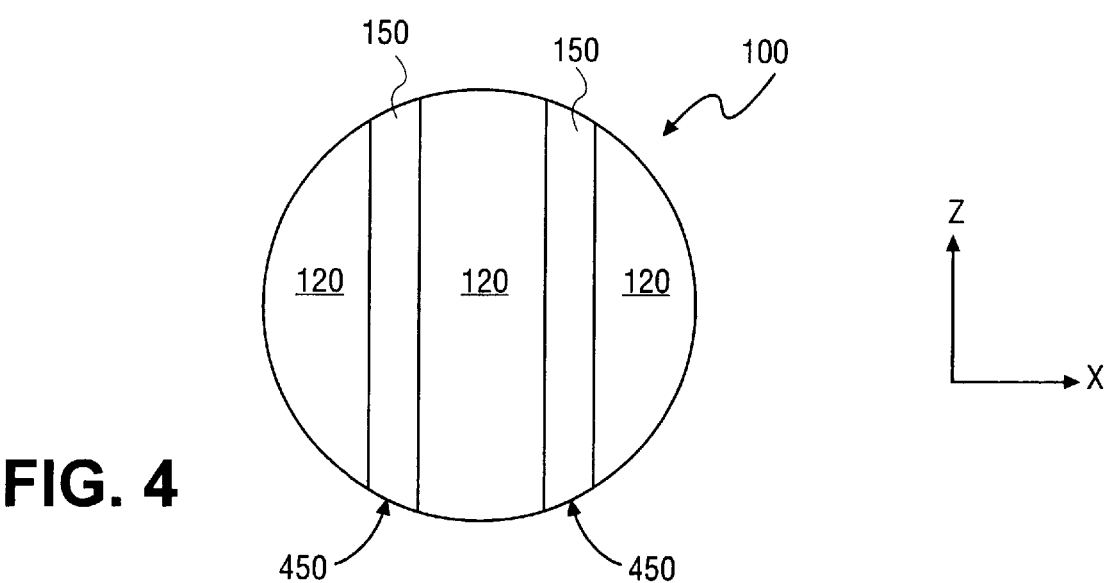
FIG. 4 shows the planar top view of a portion of the structure of FIG. 3.

FIG. 4 shows a planar top view of a portion of structure 100 of FIG. 3. FIG. 4 shows trenches 140 filled with dielectric material 150 formed in structure 100 and defining x dimensions of active areas in substrate 110 between trenches 140.

Figure 5:
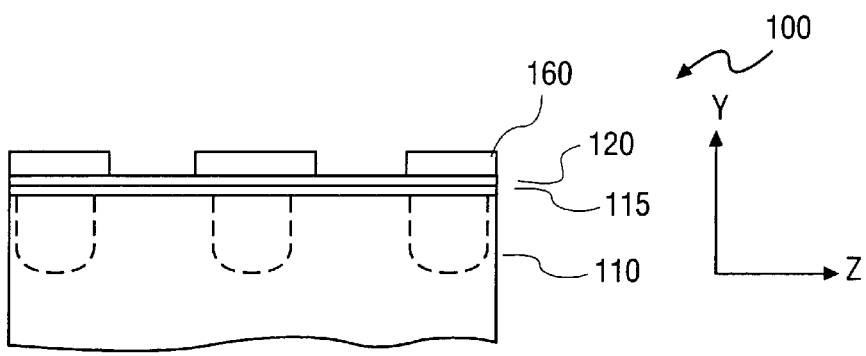
FIG. 5 shows the structure of FIGS. 3 and FIG. 4 from a second cross-sectional side view following the patterning of masking material over the surface of the substrate to define trench openings that are generally orthogonal to the first trench openings.

FIG. 5 shows a cross-sectional side view of the structure of FIG. 4 from a yz-perspective. In this view, structure 100 includes first dielectric layer 115 and second dielectric layer 120 formed over substrate 110. Also formed over substrate 110 is second masking material 160. Second masking material 160 is, for example, a photo-image material (e.g., positive photoresist) introduced and patterned to define yz direction trenches in substrate 110.

Figure 6:
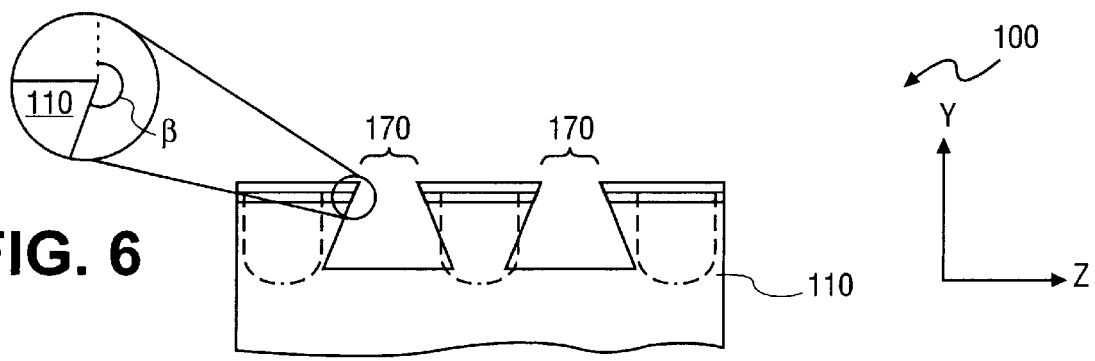
FIG. 6 shows the structure of FIG. 5 following the formation of second trenches in the substrate.

FIG. 6 shows the structure of FIG. 5 following the introduction of trenches 170 in substrate 110. Similar to the formation of trenches 140 (see FIG. 2), an etching process may be used to form trenches 170. In one embodiment, a suitable etch chemistry is one that is selective for etching silicon nitride rather than silicon dioxide. The etch chemistry is also selected, in this embodiment, to form a retrograde sidewall profiled for the trenches. By retrograde is meant that orthogonal to the surfaces of substrate 110 at the edge of a trench 170 and an edge of the sidewall of the trench define an angle, β, that is greater than 180°.

One way to form trenches 170 having a retrograde profile is with the use of an isotropic etch chemistry. For a silicon-substrate, a suitable isotropic etch chemistry is a halogen-based chemistry such as a chlorine ($Cl_2$)/hydrogen ($H_2$) etch chemistry.

Figure 7:
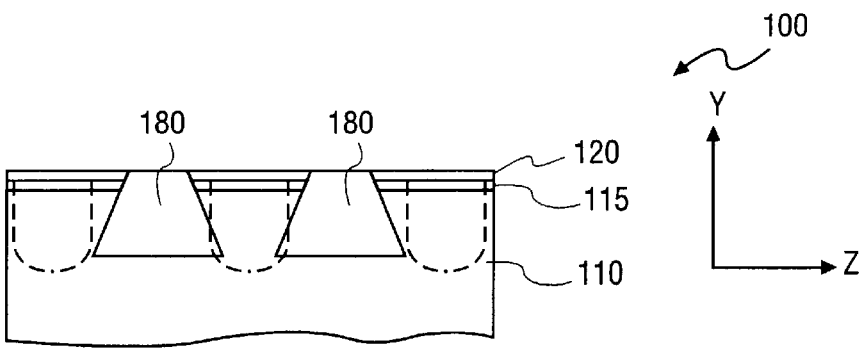
FIG. 7 shows the structure of FIG. 6 following the introduction of dielectric material into the second trenches.

FIG. 7 shows the structure of FIG. 6 following the introduction of dielectric material 180 into trenches 170. A dielectric material such as silicon dioxide introduced by CVD is suitable. FIG. 7 also shows the structure of FIG. 6 following the planarization of the superior surface (as viewed) of structure 100. A CMP is suitable for the planarization using second dielectric layer 120 as a planarization stop.

Figure 8:
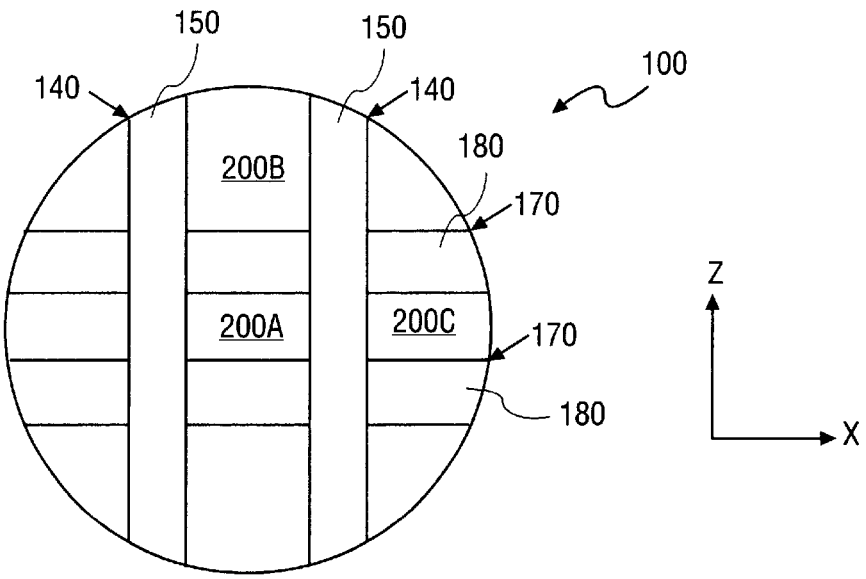
FIG. 8 shows a planar top view of a portion of the structure of FIG. 7.

FIG. 8 shows a planar top view of a portion of the structure of FIG. 7. From this view, the structure is divided into cells by orthogonally arranged dielectric filled trenches 140 (z-direction) and trenches 170 (x-direction), respectively. FIG. 8 shows cells 200A, 200B, and 200C.

Figure 9:
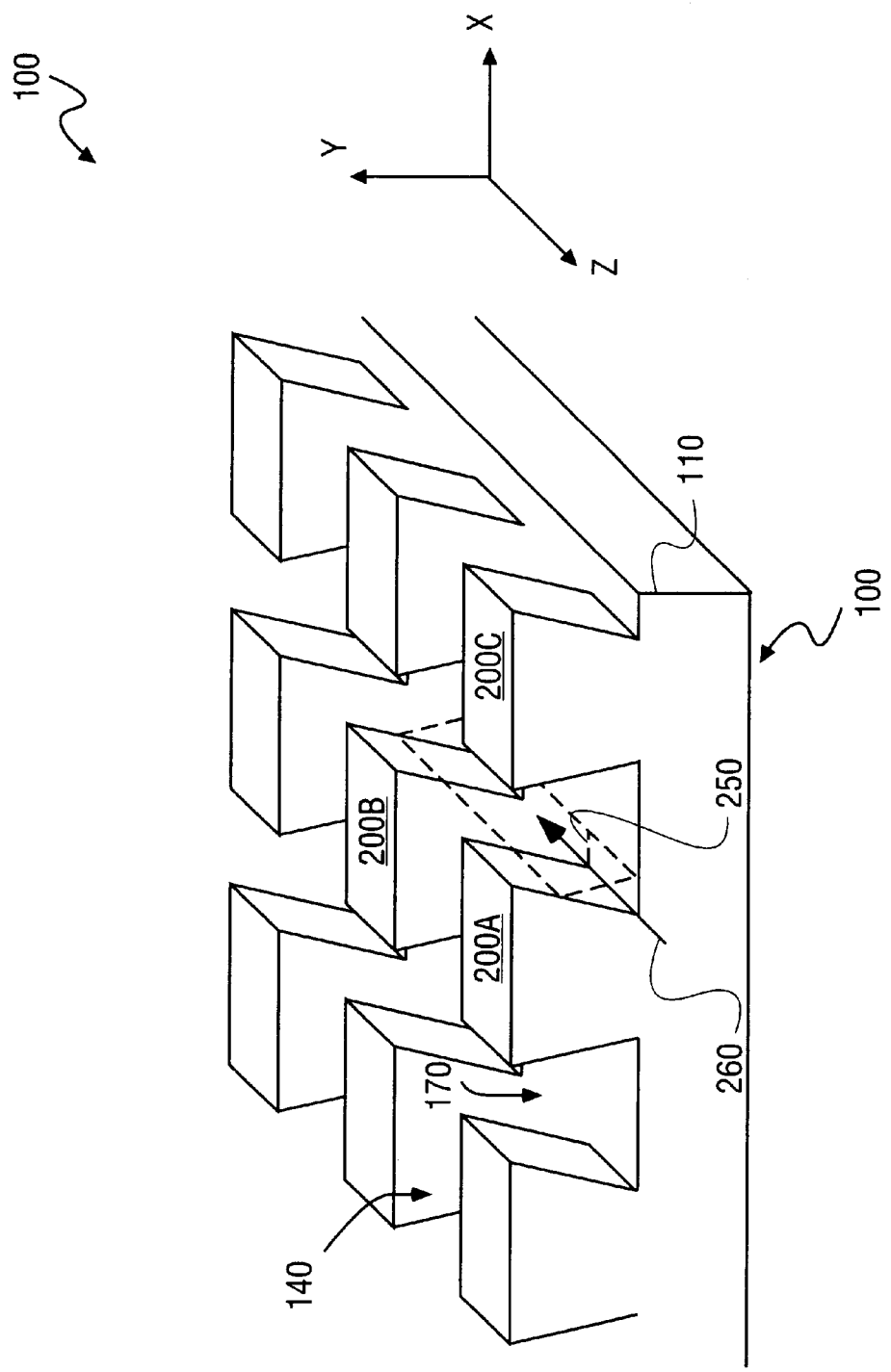
FIG. 9 shows a top perspective side view of the structure of FIG. 8 showing the trenches formed in the substrate.

FIG. 9 shows the structure of FIGS. 7 and 8 with first dielectric layer 115 and second dielectric layer 120 removed and dielectric material 150 in trenches 140 and dielectric material in trenches 170 also removed. FIG. 9 shows trenches 140 and trenches 170 formed in substrate 110 and having a generally orthogonal relationship to one another. In this embodiment, trenches 170 have a retrograde profile as described above. The trenches define device areas or cells 200A, 200B, and 200C within substrate 110.

As noted above, the retrograde profile of trenches 170 inhibits the possibility of stringers formed between device cells. FIG. 9 illustrates an example of a stringer that is avoided by the retrograde profile of trenches 170. In dashed or ghost lines, stringer 250 is illustrated. Stringer 250 could be formed where, for example, a retrograde profile such as described as attributed to trench 170 is not utilized but instead the sidewall has a prograde profile. In this case, stringer 250 exists between cell 200A and cell 200B and results from failure to adequately isolate the cells by trench formation. In such case, a current, such as illustrated by arrow 260 can flow between cells 200A and 200B. By forming the retrograde trench profiles as described, stringers such as stringer 250, may be avoided.

In the above embodiment, a method of forming isolated cells on a substrate is described. In that description, a plurality of cells 200A, 200B, 200C . . . 200N is described. Such cells are formed by intersecting trenches where at least one trench (e.g., trench 170) is formed with retrograde sidewalls. It is appreciated that multiple directional trenches (e.g., trenches 140 and trenches 170) may also be formed with the same retrograde profile using the technique (e.g., including an isotropic etch chemistry) described to form trenches 170.

Figure 10:
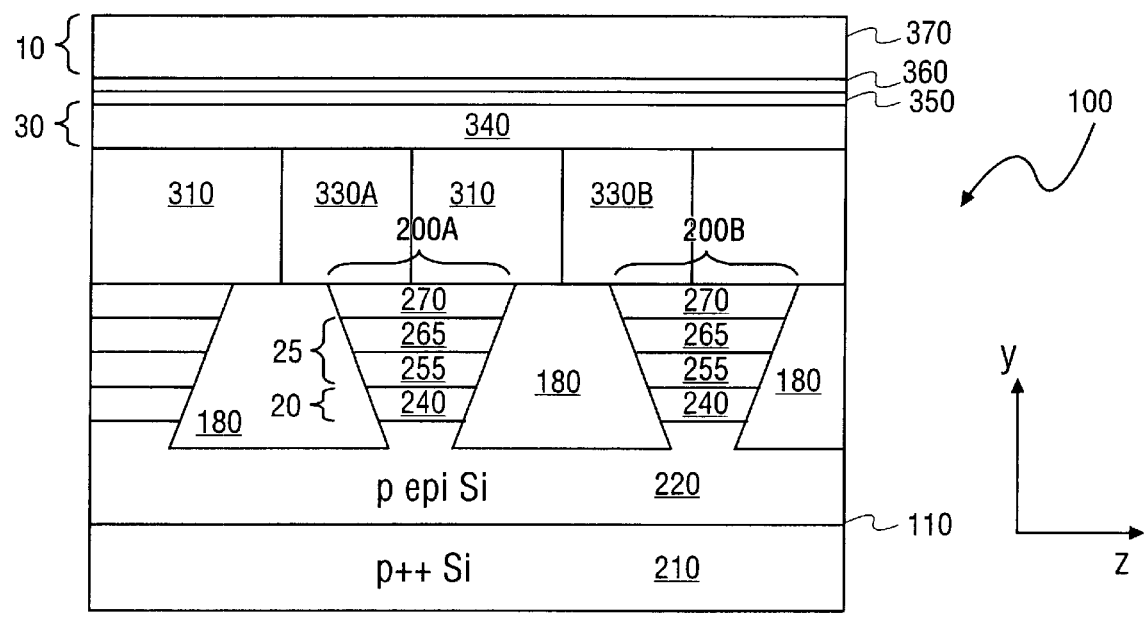
FIG. 10 shows a cross-sectional side view of the structure of FIG. 7 after the formation of memory cell devices on the structure.

FIG. 10 shows a cross-sectional side view (from a yz perspective) of a representative programmable device structure formed in conjunction with a structure such as illustrated in FIGS. 7, 8, and 9. The representative device structure utilizes a programmable material that is a phase change material, i.e., a material that can be electrically switched between a generally amorphous and a generally crystalline state, for electronic memory application. One type of programmable element utilizes various chalcognide elements as the phase change material. The phase change material represents a resistance value corresponding to the materials physical state (e.g., crystalline or amorphous).

FIG. 10 shows substrate 110 of structure 100 representatively doped such that substrate 110 includes P++portion 210 (e.g., P-type dopant on the order of $5 \times 10^{19}$ to $1 \times 10^{20}$ atoms per cubic centimeter (atoms/$cm^3$). Overlying P++portion 210 of substrate 110, in this example, is P-type epitaxial portion 220 (e.g., dopant concentration on the order of about $10^{16}$ to $10^{17}$).

Overlying P-type epitaxial portion 220 in or on substrate 110 of FIG. 10 is first conductor or signal line material 240. First conductor or signal line material 240, in this example, is N-type doped polysilicon formed by the introduction of, for example, phosphorous or arsenic to a concentration on the order of about $10^{18}$–$10^{19}$ atoms/cm$^3$ (e.g., N$^+$ silicon). In this example, first conductor or signal line material 240 serves as an address line, a row line. Overlying first conductor or signal line material 240 is an isolation device. In this example, the isolation device is a PN diode formed of N-type silicon portion 255 (dopant concentration on the order of about $10^{17}$–$10^{18}$ atoms/cm$^3$) and P-type silicon portion 265 (dopant concentration on the order of about $10^{19}$–$10^{20}$ atoms/cm$^3$). Although a PN diode is shown, it is to be appreciated that other isolation structures are similarly suitable. Such devices include, but are not limited to, metal oxide semiconductor (MOS) devices.

The formation of first conductor or signal line material 240 and isolation device 25 may follow the introduction of shallow trench isolation (STI) structures defining an x-direction thickness of the individual memory cells 200A and 200B (see, for example, the formation of STI structures formed of trenches 140 and dielectric material 150 in FIGS. 3 and 4). In such a process flow, following the formation of first conductor or signal line material 240 and isolation device 25, the z-direction thickness of the individual memory cells 200A and 200B may be defined by, for example, the techniques described above with respect to FIG. 6 through FIG. 8 and the accompanying text. In FIG. 10, the z-direction thickness of memory cells 200a and 200B are shown.

Referring to FIG. 10, overlying the isolation device in memory cells 200A and 200B (using the representative designations from FIGS. 8 and 9) is reducer material 270 of, in this example, a refractory metal silicide such as cobalt silicide (CoSi$_2$). Reducer material 270, in one aspect, serves as a low resistance material in the fabrication of peripheral circuitry (e.g., addressing circuitry) of the circuit structure on the chip in this instance. Thus, reducer material 270 is not required in terms of forming a memory element as described. Nevertheless, because of its generally low resistance property, its inclusion as part of the programmable cell structure between isolation device 25 and a memory element is utilized in this embodiment. Reducer material 270 may be formed after the formation of the x-direction and z-direction dimensions of memory cells 200A and 200B by introducing a refractory metal into a portion of, for example, P-type silicon portion 265.

Referring to FIG. 10, dielectric material 310 is introduced over the structure to a thickness on the order of 100 Å to 50,000 Å; enough to encapsulate the cell material thus define (possibly after planarization) a y-direction thickness (height) of an electrode material. In one embodiment, dielectric material 310 is silicon dioxide (SiO$_2$).

Referring to FIG. 10, trenches are formed through dielectric material 310 to reducer material 270. An electrode material of, for example, polycrystalline semiconductor material such as polycrystalline silicon is then conformally introduced along the sidewalls of the trench (FIG. 10 is a cross-section through sidewalls of the trench). Other suitable materials include carbon and semi-metals such as transition metals including, but not limited to, titanium, titanium-tungsten (TiW), titanium nitride (TiN) and titanium aluminum nitride (TiAlN). The introduction is conformal in the sense that electrode material 330 is introduced along the sidewalls and base of a trench such that electrode material 330 is in contact with reducer material 270. FIG. 10 shows electrode material 330A in contact with reducer material 270 in cell 200A and electrode material 330B in contact with reducer material 270 in cell 200B.

Programmable material 340 overlies a portion of electrode material 330A and 330B. In one example, programmable material 340 is a phase change material. In a more specific example, programmable material 340 includes a chalcogenide element(s). Examples of phase change programmable material 340 include, but are not limited to, compositions of the class of tellerium-germanium-antimony (Te$_x$Ge$_y$Sb$_z$) material. Programmable material 340, in one example according to current technology, is introduced to a thickness on the order of about 600A.

Overlying programmable material 340 in the structure of FIG. 10 are barrier materials 350 and 360 of, for example, titanium (Ti) and titanium nitride (TiN), respectively. Overlying barrier materials 350 and 360 is second conductor or signal line material 370. In this example, second conductor or signal line material 370 serves as an address line, a column line. Second conductor or signal line material 370 is, for example, an aluminum material, such as an aluminum alloy. As shown in FIG. 16, second conductor or signal line material 370 is patterned to be, in one embodiment, generally orthogonal to first conductor or signal line 240.

Figure 11:
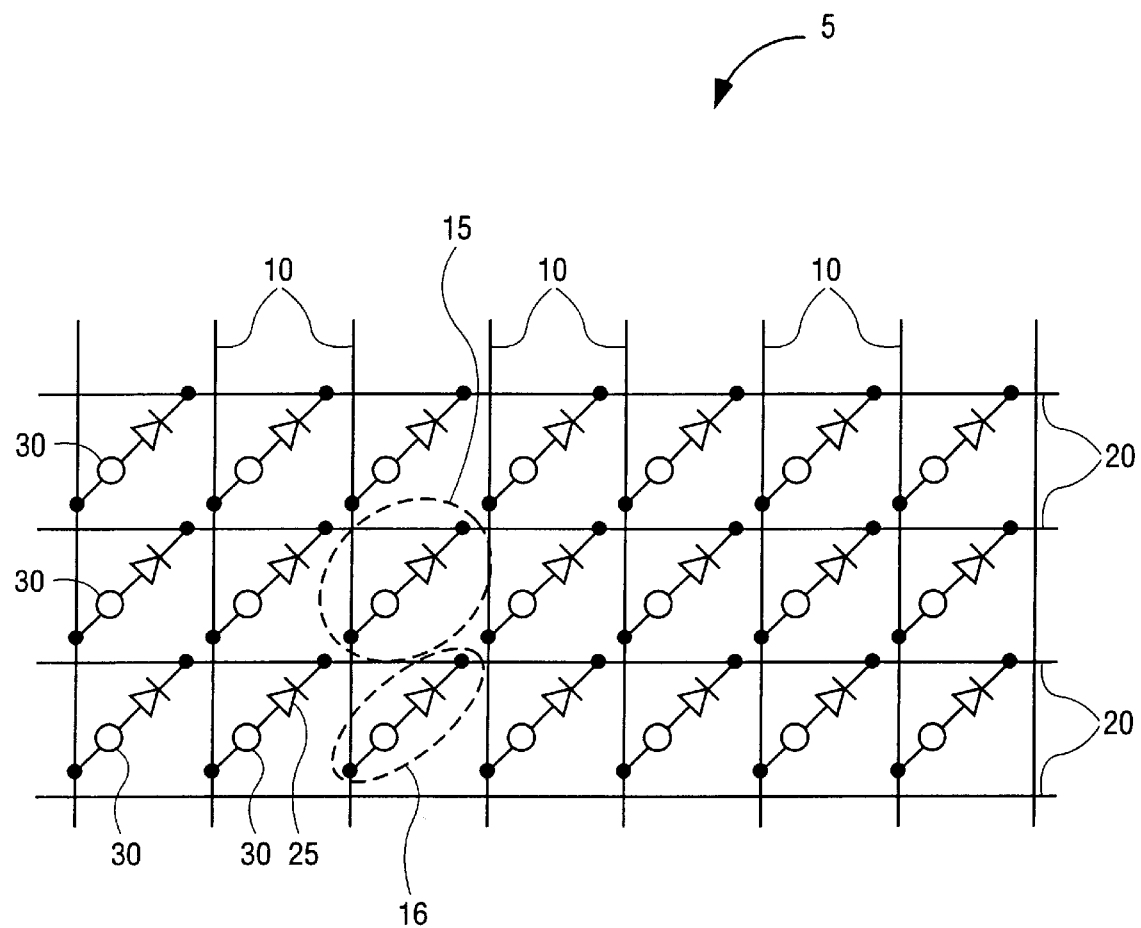
FIG. 11 is a schematic diagram of an array of memory elements.

FIG. 11 shows a schematic diagram of an embodiment of a programmable array (e.g., a memory array) comprised of a plurality of programmable elements. In this example, programmable array 5 includes an xy grid with programmable element 30 (of programmable material 340) electrically interconnected in series with isolation device 25 on a portion of a chip. Address lines 10 (e.g., columns of second conductor or signal line material 370) and 20 (e.g., rows of first conductive or signal line material 240) are connected, in one embodiment, to external addressing circuitry. One purpose of the xy grid array of programmable elements in combination with isolation devices is to enable each discrete programmable element to be read and written without interfering with the information stored in adjacent or remote programmable elements of the array. Programmable device 15 is formed, for example, in and on cell 200A while programmable device 16 is formed in and on cell 200B.

In the preceding detailed description, reference to specific embodiments are presented. It will, however, be evident that various modifications and changes may be made thereto without departing from the broader spirit and scope of the invention as set forth in the claims. For example, the representative programmable cell structure of FIG. 10 and the array of FIG. 11 is one example of a structure utilizing the isolation technique described herein. It is appreciated that the retrograde technique may be used in many other areas where device isolation is desired. The specification and drawings are, accordingly, to be regarded in an illustrative rather than a restrictive sense.

What is claimed is:

1. A method comprising:
    forming a first trench in a substrate; and
    forming a second trench in the substrate by etching the substrate with an isotropic etch chemistry, the second trench intersecting the first trench and having a retrograde sidewall profile relative to a direction from a top of the trench to a bottom of the trench.

2. The method of claim 1, wherein the substrate comprises silicon and the second trench is formed in silicon and forming the second trench comprises etching the silicon with a halogen-based etch chemistry.

3. The method of claim 1, wherein the second trench orthogonally intersects the first trench.

4. The method of claim 1, further comprising forming a dielectric material in the first trench and the second trench.

5. The method of claim 1, wherein the first trench and the second trench define boundaries of a cell, the method further comprising:

forming a device structure in a portion of the cell.

6. The method of claim 5, wherein forming a device structure comprises forming a programmable device structure.

7. A method comprising:

defining a matrix of cells in a substrate by forming a plurality of first trenches and a plurality of second trenches, wherein forming the plurality of second trenches comprises etching the substrate with an isotropic etch chemistry, the plurality of second trenches intersecting the plurality of first trenches and having a retrograde sidewall profile relative to a direction from a top to a bottom of the respective trench; and electrically isolating respective ones of the matrix of cells.

8. The method of claim 7, wherein the substrate comprises silicon and the plurality of second trenches are formed in silicon and forming the plurality of second trenches comprises etching the substrate with a halogen-based etch chemistry.

9. The method of claim 7, wherein the plurality of second trenches orthogonally intersect the plurality of first trenches.

10. The method of claim 7, wherein electrically isolating respective ones of the matrix of cells comprises forming dielectric material in the plurality of first trenches and the plurality of second trenches.

11. The method of claim 7, further comprising coupling an electrically accessible storage device to respective ones of the matrix of cells.

12. The method of claim 7, wherein the plurality of first trenches have a retrograde profile.

* * * * *